US008370784B2

(12) United States Patent
Padmanabhan et al.

(10) Patent No.: US 8,370,784 B2
(45) Date of Patent: Feb. 5, 2013

(54) AUTOMATIC OPTIMAL INTEGRATED CIRCUIT GENERATOR FROM ALGORITHMS AND SPECIFICATION

(75) Inventors: Satish Padmanabhan, Sunnyvale, CA (US); Plus Ng, Hillsboro, OR (US); Anand Pandurangan, Bangalore (IN); Suresh Kadiyala, Cupertino, CA (US); Ananth Durbha, San Jose, CA (US); Tak Shigihara, Saratoga, CA (US)

(73) Assignee: Algotochip Corporation, Sunnyvale, CA (US)

( * ) Notice: Subject to any disclaimer, the term of this patent is extended or adjusted under 35 U.S.C. 154(b) by 219 days.

(21) Appl. No.: 12/835,621

(22) Filed: Jul. 13, 2010

(65) Prior Publication Data

US 2012/0017187 A1 Jan. 19, 2012

(51) Int. Cl.
*G06F 9/455* (2006.01)
*G06F 17/50* (2006.01)

(52) U.S. Cl. ........ 716/132; 716/101; 716/106; 716/108; 716/113; 716/134

(58) Field of Classification Search .......... 716/106–109, 716/111–113, 132–135, 139, 100–102
See application file for complete search history.

(56) References Cited

U.S. PATENT DOCUMENTS

| 6,408,428 B1* | 6/2002 | Schlansker et al. ........... 716/104 |
| 2003/0204819 A1* | 10/2003 | Matsumoto et al. .............. 716/1 |
| 2006/0230377 A1* | 10/2006 | Rapp et al. ...................... 716/18 |
| 2006/0242385 A1* | 10/2006 | Murakami et al. ............. 712/200 |
| 2006/0259885 A1* | 11/2006 | Mortensen et al. ................ 716/7 |
| 2007/0250800 A1* | 10/2007 | Keswick ............................ 716/8 |
| 2008/0177996 A1* | 7/2008 | Simar et al. ................... 713/100 |
| 2010/0293512 A1* | 11/2010 | Buck et al. ........................ 716/2 |
| 2011/0029942 A1* | 2/2011 | Liu et al. ....................... 716/102 |

\* cited by examiner

*Primary Examiner* — Thuan Do
*Assistant Examiner* — Nha Nguyen
(74) *Attorney, Agent, or Firm* — Tran & Associates

(57) ABSTRACT

Systems and methods are disclosed to automatically design a custom integrated circuit based on algorithmic process or code as input and using highly automated tools that requires virtually no human involvement is disclosed. The method includes receiving a specification of the custom integrated circuit including computer readable code and one or more constraints on the custom integrated circuit; automatically generating a computer architecture for the computer readable code that best fits the constraints; automatically determining an instruction execution sequence based on the code profile and reassigning or delaying the instruction sequence to spread operation over one or more processing blocks to reduce hot spots; continuously evaluating and optimizing one or more factors including physical implementation, and local and global area, timing, or power at an architecture level above RTL or gate-level synthesis; automatically generating a software development kit (SDK) and the associated firmware automatically to execute the computer readable code on the custom integrated circuit; automatically generating associated test suites and vectors for the computer readable code on the custom integrated circuit; and automatically synthesizing the designed architecture and generating a computer readable description of the custom integrated circuit for semiconductor fabrication.

22 Claims, 7 Drawing Sheets

Variable Lifetime

Mnemonic Execution Sequence

Variable Lifetime

Mnemonic Execution Sequence

AUTOMATIC OPTIMAL INTEGRATED CIRCUIT GENERATOR FROM ALGORITHMS AND SPECIFICATION

CROSS-REFERENCED APPLICATIONS

This application is related to commonly owned, concurrently filed application Ser. No. 12/835,603 entitled "AUTOMATIC OPTIMAL INTEGRATED CIRCUIT GENERATOR FROM ALGORITHMS AND SPECIFICATION", application Ser. No 12/835,628 entitled "APPLICATION DRIVEN POWER GATING", application Ser. No. 12/835,631 entitled "SYSTEM, ARCHITECTURE AND MICRO-ARCHITECTURE (SAMA) REPRESENTATION OF AN INTEGRATED CIRCUIT", and application Ser. No. 12/835,640 entitled "ARCHITECTURAL LEVEL POWER-AWARE OPTIMIZATION AND RISK MITIGATION", the contents of which are incorporated by reference.

BACKGROUND

The present invention relates to a method for designing a custom integrated circuit or an application-specific integrated circuit (ASIC).

Modern electronic appliances and industrial products rely on electronic devices such as standard and custom integrated circuits (ICs). An IC designed and manufactured for specific purposes is called an ASIC. The number of functions, which translates to transistors, included in each of those ICs has been rapidly growing year after year due to advances in semiconductor technology. Reflecting such trends, methods of designing ICs have been changing. In the past, an IC used to be designed as a mere combination of a number of general-purpose ICs. Recently, however, the designer needs to create his or her original IC such that the IC can perform any function as required. In general, unit costs and sizes are decreasing while design functionality is increasing.

Normally the chip design process begins when algorithm designers specify all the functionality that the chip must perform. This is usually done in a language like C or Matlab. Then it takes a team of chip specialists, tools engineers, verification engineers and firmware engineers many man-years to map the algorithm to a hardware chip and associated firmware. This is a very expensive process and also fraught with lot of risks.

Today's designs are increasingly complex, requiring superior functionality combined with constant reductions in size, cost and power. Power consumption, signal interactions, advancing complexity, and worsening parasitics all contribute to more complicated chip design methodology. Design trends point to even higher levels of integration, with transistor counts exceeding millions of transistors for digital designs. With current technology, advanced simulation tools and the ability to reuse data are falling behind such complex designs.

Developing cutting-edge custom IC designs has introduced several issues that need to be resolved. Higher processing speeds have introduced conditions into the analog domain that were formerly purely digital in nature, such as multiple clock regions, increasingly complex clock multiplication and synchronization techniques, noise control, and high-speed I/O. Impediments occur in the design and verification cycle because design complexity continues to increase while designers have less time to bring their products to market, resulting in reduced amortization for design costs. Another effect of increased design complexity is the additional number of production turns that may be needed to achieve a successful design. Yet another issue is the availability of skilled workers. The rapid growth in ASIC circuit design has coincided with a shortage of skilled IC engineers.

SUMMARY

In one aspect, a method to automatically design a custom integrated circuit based on algorithmic process or code as input and using highly automated tools that requires virtually no human involvement is disclosed.

The method includes receiving a specification of the custom integrated circuit including computer readable code and one or more constraints on the custom integrated circuit; automatically generating a computer architecture for the computer readable code that best fits the constraints; automatically determining an instruction execution sequence based on the code profile and reassigning or delaying the instruction sequence to spread operation over one or more processing blocks to reduce hot spots; continuously evaluating and optimizing one or more factors including physical implementation, and local and global area, timing, or power at an architecture level above RTL or gate-level synthesis; automatically generating a software development kit (SDK) and the associated firmware automatically to execute the computer readable code on the custom integrated circuit; automatically generating associated test suites and vectors for the computer readable code on the custom integrated circuit; and automatically synthesizing the designed architecture and generating a computer readable description of the custom integrated circuit for semiconductor fabrication.

In another aspect, a method to automatically design a custom integrated circuit with minimal human involvement includes receiving a specification of the custom integrated circuit including computer readable code and one or more constraints on the custom integrated circuit; automatically devising a processor architecture and generating a processor chip specification uniquely customized to the computer readable code which satisfies the constraints; and synthesizing the chip specification into a layout of the custom integrated circuit. This aspect is also performed using highly automated tools that require virtually no human involvement.

Implementations of the above aspects may include one or more of the following. The system includes performing static profiling of the computer readable code and/or dynamic profiling of the computer readable code. A system chip specification is designed based on the profiles of the computer readable code. The chip specification can be further optimized incrementally based on static and dynamic profiling of the computer readable code. The computer readable code can be compiled into optimal assembly code, which is linked to generate firmware for the selected architecture. A simulator can perform cycle accurate simulation of the firmware. The system can perform dynamic profiling of the firmware. The method includes optimizing the chip specification further based on profiled firmware or based on the assembly code. The system can automatically generate register transfer level (RTL) code for the designed chip specification. The system can also perform synthesis of the RTL code to fabricate silicon.

Advantages of the preferred embodiments of the system may include one or more of the following. The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed.

The instant system removes the risk and makes chip design an automatic process so that the algorithm designers themselves can directly make the hardware chip without any chip design knowledge. The primary input to the system would be the computer readable code or algorithm specification in higher-level languages like C or Matlab.

Of the many benefits, the benefits of using the system may include
1) Schedule: If chip design cycles become measured in weeks instead of years, the companies using The instant system can penetrate rapidly changing markets by bringing their products quickly to the market.
2) Cost: The numerous engineers that are usually needed to be employed to implement chips are made redundant. This brings about tremendous cost savings to the companies using The instant system.
3) Optimality : The chips designed using The instant system product have superior performance, Area and Power consumption.

The instant system is a complete shift in paradigm in methodology used in design of systems that have a digital chip component to it. The system is a completely automated software product that generates digital hardware from algorithms described in C/Matlab. The system uses a unique approach to the process of taking a high level language such as C or Matlab to realizable hardware chip. In a nutshell, it makes chip design a completely automated software process.

DESCRIPTION

Figure 1:
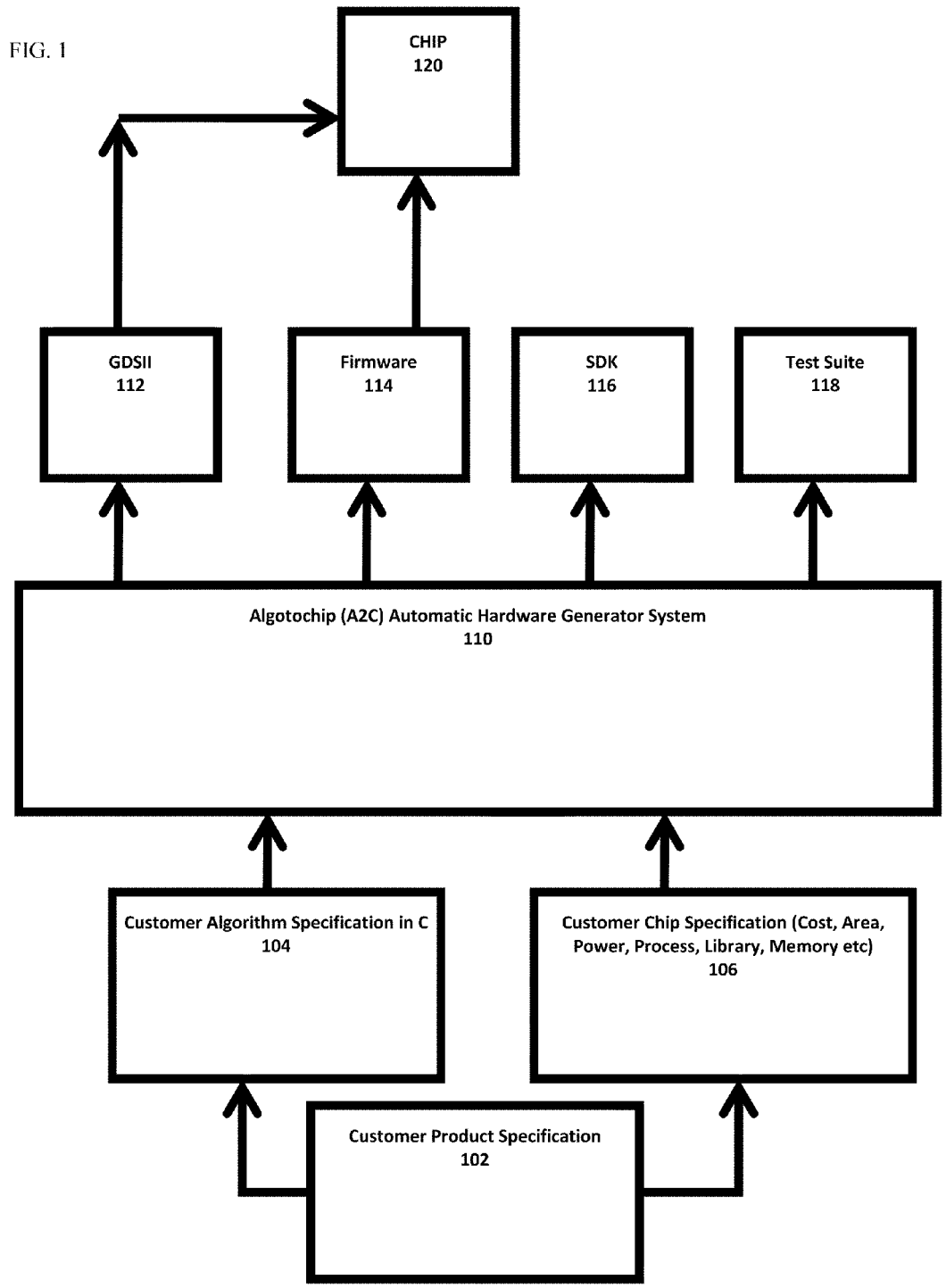
FIG. 1 shows an exemplary system to automatically generate a custom IC.

FIG. 1 shows an exemplary system to automatically generate a custom IC. The system of FIG. 1 supports an automatic generation of the optimal custom integrated circuit solution for the chosen target application. The target application specification is usually done through algorithm expressed as computer readable code in a high-level language like C, Matlab, SystemC, Fortran, Ada, or any other language. The specification includes the description of the target application and also one or more constraints such as the desired cost, area, power, speed, performance and other attributes of the hardware solution.

In FIG. 1, an IC customer generates a product specification 102. Typically there is an initial product specification that captures all the main functionality of a desired product. From the product, algorithm experts identify the computer readable code or algorithms that are needed for the product. Some of these algorithms might be available as IP from third parties or from standard development committees. Some of them have to be developed as part of the product development. In this manner, the product specification 102 is further detailed in a computer readable code or algorithm 104 that can be expressed as a program such as C program or a math model such as a Matlab model, among others. The product specification 102 also contains requirements 106 such as cost, area, power, process type, library, and memory type, among others.

The computer readable code or algorithm 104 and requirement 106 are provided to an automated IC generator 110. Based only on the code or algorithm 104 and the constraints placed on the chip design, the IC generator 110 uses the process of FIG. 2 to automatically generate with no human involvement an output that includes a GDS file 112, firmware 114 to run the IC, a software development kit (SDK) 116, and/or a test suite 118. The GDS file 112 is used to fabricate a custom chip 120. The firmware 114 is then run on this fabricated chip to implement the customer product specification 102

The instant system alleviates the issues of chip design and makes it a simple process. The system shifts the focus of product development process back from the hardware implementation process back to product specification and algorithm design. Instead of being tied down to specific hardware choices, the algorithm can always be implemented on a digital chip processor that is optimized specifically for that application. The system generates this optimized processor automatically along with all the associated software tools and firmware applications. This whole process can be done in a matter of days instead of years that it takes now. In a nutshell the system makes the digital chip design portion of the product development in to a black box.

In one embodiment, the instant system product can take as input the following:
Computer readable code or algorithm defined in C/Matlab
Peripherals required
IO Specification
Area Target
Power Target
Margin Target (how much overhead to build in for future firmware updates and increases in complexity)
Process Choice
Standard Cell library Choice
Memory compiler Choice
Testability (scan, tap controller, bist etc)

The output of the system may be a Digital Hard macro along with all the associated firmware. A software development kit (SDK) optimized for this Digital Hard macro is also automatically generated so that future upgrades to firmware are implemented without having to change the processor.

Figure 2:
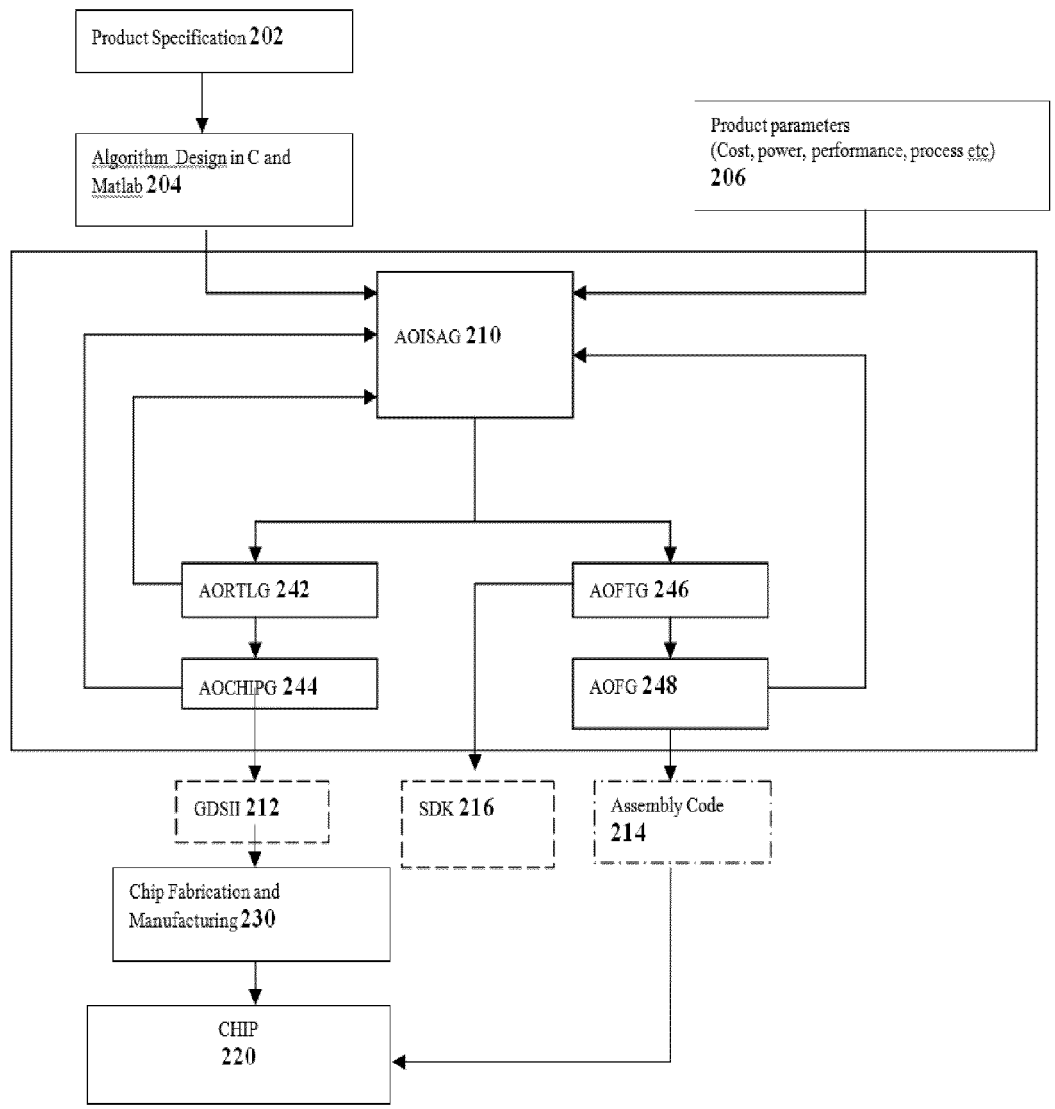
FIG. 2 shows an exemplary workflow to automatically generate a custom IC.

FIG. 2 shows an exemplary workflow to automatically generate a custom IC. This system performs automatic generation of the complete and optimal hardware solution for any chosen target application. While the common target applications are in the embedded applications space they are not necessarily restricted to that.

Referring to FIG. 2, an ASIC customer generates a product specification 202. The product specification 202 is further detailed in a computer readable code or algorithm 204 that can be expressed as a program such as C program or a math model such as a Matlab model, among others. The product specification 202 also contains product parameters and requirements 206 such as cost, area, power, process type, library, and memory type, among others. The computer readable code or algorithm 204 and product parameters 206 are provided to an automated IC generator 110 including an Automatic Optimal Instruction Set Architecture Generator (AOISAG) (210). The generator 210 controls an Automatic Optimal RTL Generator (AORTLG) 242, which drives an Automatic Optimal Chip Generator (AOCHIPG) 244. The output of AOCHIPG 244 and AORTLG 242 is provided in a feedback loop to the AOISAG 210. The AOISAG 210 also controls an Automatic Optimal Firmware Tools Generator (AOFTG) 246 whose output is provided to an Automatic Optimal Firmware Generator (AOFG) 248. The AOFG 248 output is also provided in a feedback loop to the AOISAG.

The IC generator 110 generates as output a GDS file 212, firmware 214 to run the IC, a software development kit (SDK) 216. The GDS file 212 and firmware 214 are provided to an IC fabricator 230 such as TSMC or UMC to fabricate a custom chip 220.

In one embodiment, the system is completely automated. No manual intervention or guidance is needed. The system is optimized. The tool will automatically generate the optimal solution. In other embodiments, the user can intervene to provide human guidance if needed.

The AOISAG 210 can automatically generate an optimal instruction set architecture (called ISA). The ISA is defined to be every single detail that is required to realize the programmable hardware solution and encompasses the entire digital chip specification. The details can include one or more of the following exemplary factors:
1) Instruction set functionality, encoding and compression
2) Co-processor/multi-processor architecture
3) Scalarity
4) Register file size and width. Access latency and ports
5) Fixed point sizes
6) Static and dynamic branch prediction
7) Control registers
8) Stack operations
9) Loops
10) Circular buffers
11) Data addressing
12) Pipeline depth and functionality
13) Circular buffers
14) Peripherals
15) Memory access/latency/width/ports
16) Scan/tap controller
17) Specialized accelerator modules
18) Clock specifications
19) Data Memory and Cache system
20) Data pre-fetch Mechanism
21) Program memory and cache system
22) Program pre-fetch mechanism The AORTLG 242 is the Automatic Optimal RTL Generator providing an automatic generation of the hardware solution in Register Transfer Language (RTL) from the optimal ISA. The AORTLG 242 is completely automated. No manual intervention or guidance is needed. The tool will automatically generate the optimal solution. The RTL generated is synthesizable and compilable.

The AOCHIPG 244 is the Automatic Optimal Chip Generator that provides automatic generation of the GDSII hardware solution from the optimal RTL. The tool 244 is completely automated. No manual intervention or guidance is needed. The tool will automatically generate the optimal solution. The chip generated is completely functional and can be manufactured using standard FABs without modification.

The AOFTG 246 is the Automatic Optimal Firmware Tools Generator for an automatic generation of software tools needed to develop firmware code on the hardware solution. It is completely automated. No manual intervention or guidance is needed. The tool will automatically generate the optimal solution. Standard tools such as compiler, assembler, linker, functional simulator, cycle accurate simulator can be automatically generated based on the digital chip specification. The AOFG 248 is the Automatic Optimal Firmware Generator, which performs the automatic generation of the firmware needed to be executed by the resulting chip 120. The tool is completely automated. No manual intervention or guidance is needed. Additionally, the tool will automatically generate the optimal solution. An optimized Real Time Operating System (RTOS) can also be automatically generated.

The chip specification defines the exact functional units that are needed to execute the customer application. It also defines exactly the inherent parallelism so that the number of these units that are used in parallel is determined. All the complexity of micro and macro level parallelism is extracted from the profiling information and hence the chip specification is designed with this knowledge. Hence the chip specification is designed optimally and not over designed or under-designed as such could be the case when a chip specification is designed without such profiling information.

During the dynamic profiling the branch statistics are gathered and based on this information the branch prediction mechanism is optimally designed. Also all the dependency checks between successive instructions are known from the profiling and hence the pipeline and all instruction scheduling aspects of the chip specification are optimally designed.

The chip specification can provide options such as:
Hardware modulo addressing, allowing circular buffers to be implemented without having to constantly test for wrapping.
Memory architecture designed for streaming data, using DMA extensively and expecting code to be written to know about cache hierarchies and the associated delays.
Driving multiple arithmetic units may require memory architectures to support several accesses per instruction cycle
Separate program and data memories (Harvard architecture), and sometimes concurrent access on multiple data busses
Special SIMD (single instruction, multiple data) operations
Some processors use VLIW techniques so each instruction drives multiple arithmetic units in parallel
Special arithmetic operations, such as fast multiply-accumulates (MACs).
Bit-reversed addressing, a special addressing mode useful for calculating FFTs
Special loop controls, such as architectural support for executing a few instruction words in a very tight loop without overhead for instruction fetches or exit testing
Special Pre-fetch instructions coupled with Data pre-fetch mechanism so that the execution units are never stalled for lack of data. So the memory bandwidth is designed optimally for the given execution units and the scheduling of instructions using such execution units.
Optimal Variable/Multi-Discrete length instruction encoding to get optimal performance and at the same time achieve very compact instruction footprint for the given application.

Figure 3:
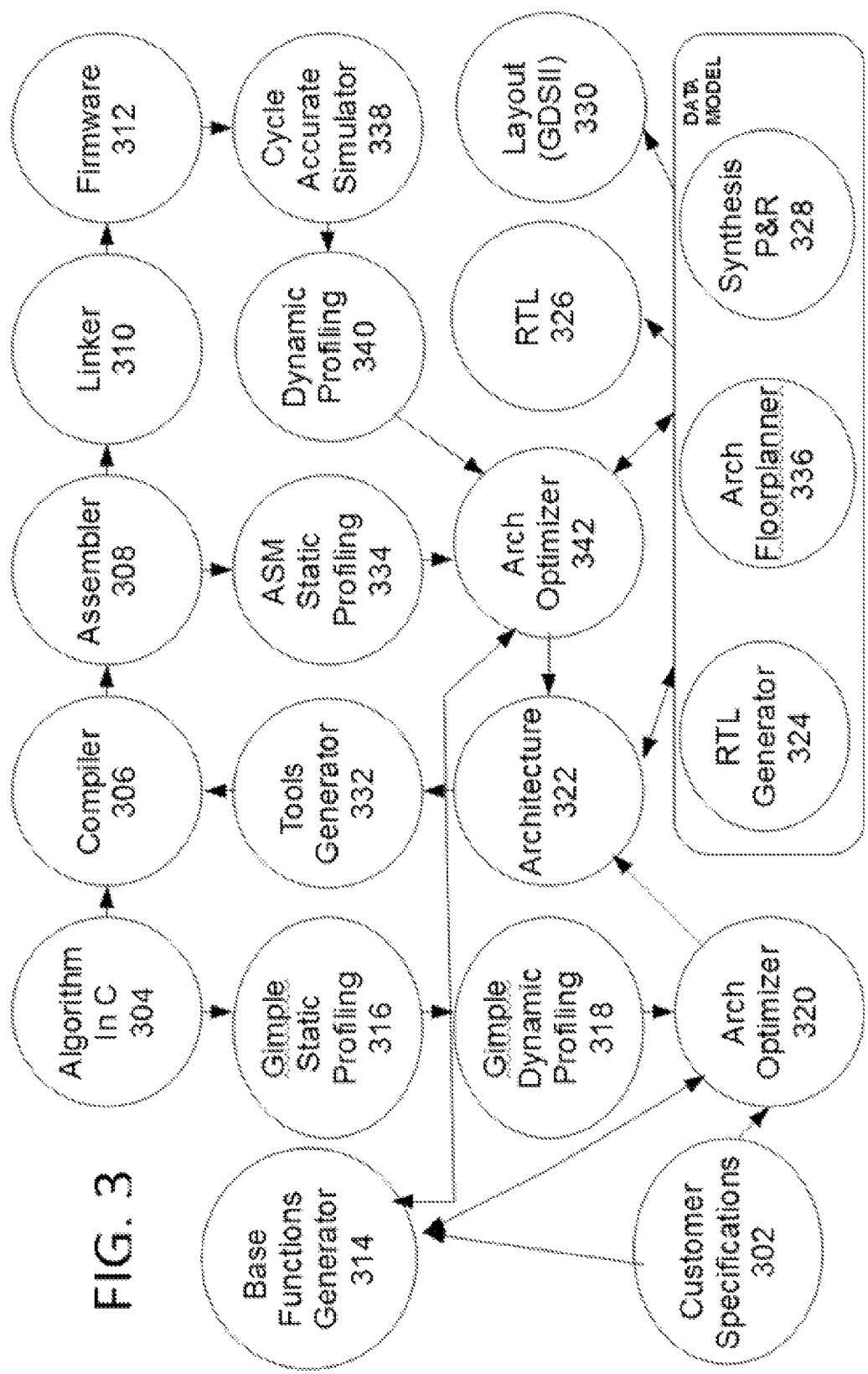
FIG. 3 shows an exemplary process to automatically generate a custom IC.

FIG. 3 shows an exemplary process flow for automatically generating the custom chip 120 of FIG. 1. Turning now to FIG. 3, a customer product specification is generated (302). The customer product specification 302 is further detailed in a computer readable code or algorithm 304 that can be expressed as a program such as C program or a math model such as a Matlab model, among others.

The customer algorithm 304 is profiled statically 316 and dynamically 318. The statistics gathered from this profiling is used in the architecture optimizer unit 320. This unit also receives the customer specification 302. The base functions generator 314 decides on the basic operations or execution units that will be needed to implement the customer algorithm 304. The base function generators 314 output is also fed to the architecture optimizer 320. The architecture optimizer 320, armed with the area, timing, and power information from base function generators along with internal implementation analysis to minimize area, timing, and power.

Based on the architecture optimizer 320 outputs and initial chip specification is defined as the architecture 322. This is then fed to the tools generator 332 unit to automatically generate the compiler 306, the Assembler 308, the linker 310, the cycle accurate simulator 338. Then using the tools chain the customer algorithm 304 is converted to firmware 312 that can run on the architecture 322.

The output of the assembler 308 is profiled statically 334 and the output of the cycle accurate simulator 338 is profiled dynamically 340. These profile information is then used by the architecture optimizer 342 to refine and improve the architecture 322.

The feedback loop from 322 to 332 to 306 to 308 to 310 to 312 to 338 to 340 to 342 to 322 and the feedback loop from 322 to 332 to 306 to 308 to 334 to 342 to 322 is executed repeatedly till the customer specifications are satisfied. These feedback loops happen automatically with no human intervention and hence the optimal solution is arrived at automatically.

The architecture optimizer 342 also is based on the architecture floor-planner 336 and synthesis and P&R 328 feedback. Architecture decisions are made in consultation with not only the application profiling information but also the physical place and route information. The architecture optimization is accurate and there are no surprises when the backend design of the designed architecture takes place. For example if the architecture optimizer chooses to use a multiplier unit that takes two 16 bit operands as input and generates a 32 bit result. The architecture optimizer 342 knows the exact timing delay between the application of the operands and the availability of the result from the floor-planner 336 and the synthesis 328. The architecture optimizer 342 also knows the exact area when this multiplier is placed and routed in the actual chip. So the architecture decision for using this multiplier is not only based on the need of this multiplier from the profiling data, but also based on the cost associated with this multiplier in terms of area, timing delay (also called performance) and power.

In another example, to speed up the performance if performance is a constraint on the custom chip, the compiler 306 takes a program, code or algorithm that takes long time to run on a serial processor, and given a new architecture containing multiple processing units that can operate concurrently the objective is to shorten the running time of the program by breaking it up into pieces that can be processed in parallel or in overlapped fashion in multiprocessing units. An additional task of front end is to look for parallelism and that of back end is to schedule it in such a manner that correct result and improved performance is obtained. The system determines what kind of pieces a program should be divided into and how these pieces may be rearranged. This involves granularity, level, and degree of parallelism analysis of the dependencies among the candidates of parallel execution.

In another example, if space or power is a constraint on the custom chip, the compiler would generate a single low power processor/DSP that executes the code sequentially to save power and chip real estate requirement, for example.

From the architecture block 322, the process can generate RTL using an RTL generator (324). RTL code is generated (326) and the RTL code can be provided to a synthesis placement and routing block (328). Information from an architecture floor planner can also be considered (336). The layout can be generated (330). The layout can be GDSII file format, for example.

One aspect of the invention also is the unified architecture 322 representation that is created so that both the software tools generator 332 and the hardware RTL generator 324 can use this representation. This representation is called as SAMA (system, architecture and micro-architecture).

The architecture design operation is based on analyzing the program, code or algorithm to be executed by the custom chip. In one implementation, given a program that takes long time to run on a uniscalar processor the system can improve performance by breaking the processing requirement into pieces that can be processed in parallel or in overlapped fashion in multiprocessing units. Additional task of front end is to look for parallelism and that of back end is to schedule it in such a manner that correct result and improved performance is obtained. The system can determine what kind of pieces a program should be divided into and how these pieces may be rearranged. This involves granularity, degree of parallelism, as well as an analysis of the dependencies among the candidates of parallel execution. Since program pieces and the multiple processing units come in a range of sizes, a fair number of combinations are possible, requiring different compiling approaches.

For these combinations the chip specification is done in such a way that the data bandwidth that is needed to support the compute units is correctly designed so that there is no over or under design. The Architecture Optimizer 342 first identifies potential parallel units in the program then performs dependency analysis on them to find those segments which are independent of each other and can be executed concurrently.

The architecture optimizer 342 identifies parallelism at granularity level of machine instruction. For example addition of two N-element vectors on an ordinary scalar processor will execute one instruction at a time. But on a vector processor all N instructions can be executed on N separate processor which reduces the total time to slightly more than N times that needed to execute a single addition. The architecture optimizer takes the sequential statements equivalent to the vector statement and performs a translation into vector machine instruction. The condition that allows vectorization is that the elements of the source operands must be independent of the result operands. For example, in the code:

```
    DO 100 J = 1,N
        DO 100 I = 1,N
            DO 100 K = 1,N
                C(I,J) = C(I,J) + A(I,K) * B(K,J)
100 CONTINUE
```

In this matrix multiplication example at each iteration C(I,J) is calculated using previous value of C(I,J) calculated in previous iteration so vectorization is not possible. If performance is desired, the system transforms the code into:

```
        DO 100 J = 1,N
            DO 100 K = 1,N
                DO 100 I = 1,N
                    C(I,J) = C(I,J) + A(I,K) * B(K,J)
    100 CONTINUE
```

In this case vectorization is possible because consecutive instructions calculate C(I-1,J) and C(I,J) which are independent of each other and can be executed concurrently on different processors. Thus dependency analysis at instruction level can help to recognize operand level dependencies and apply appropriate optimization to allow vectorization.

Figure 4:
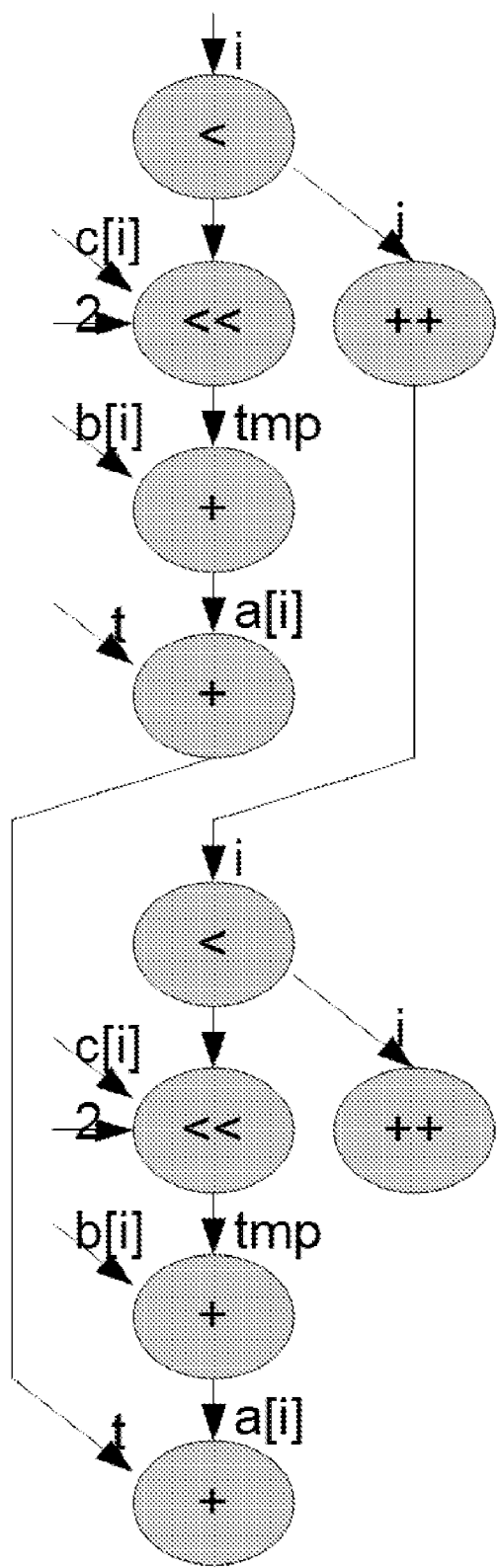
FIG. 4 shows an exemplary C code profile.
Figure 5:
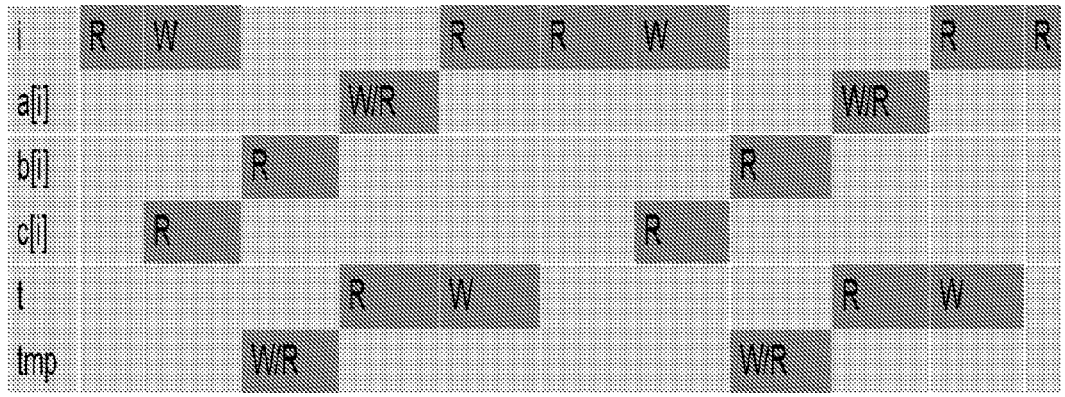
FIG. 5 shows a base level chip specification.
Figure 5:
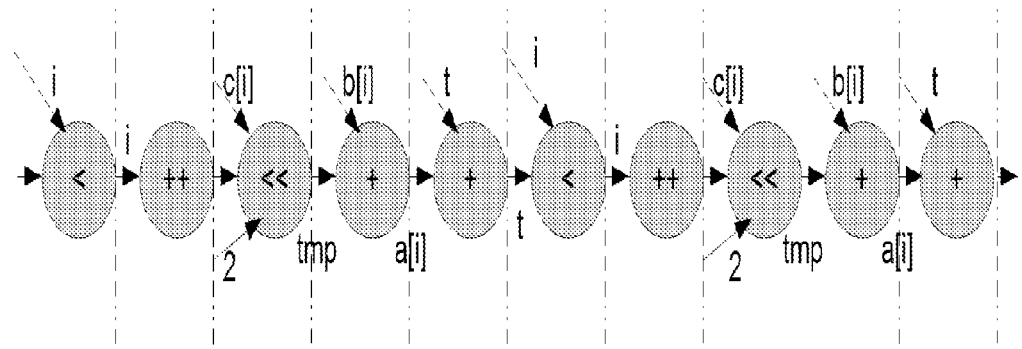
Figure 6:
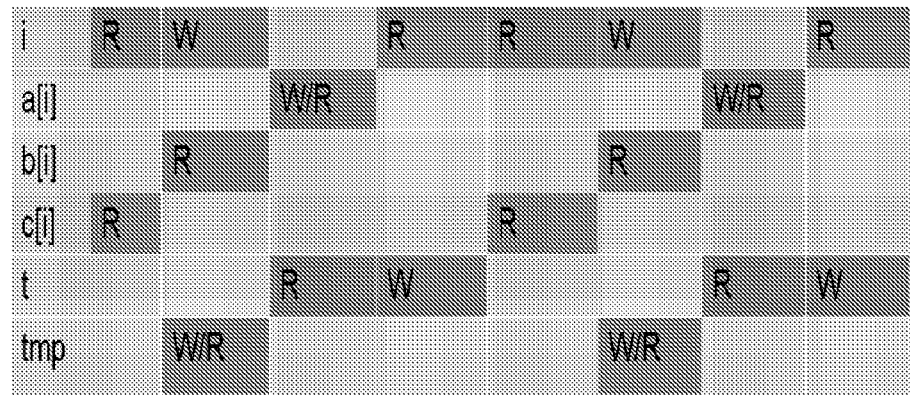
FIG. 6 shows a first architecture from the chip specification of FIG. 5.
Figure 6:
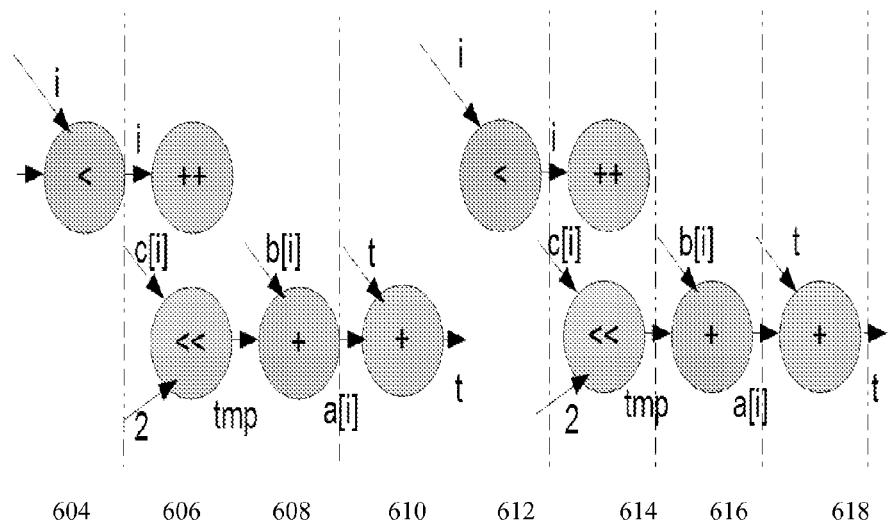

FIGS. 4-6 show an exemplary process for performing custom chip specification design for the following algorithm expressed as C code:

```
        for (i=0; i < ilimit; i++) {
            a[i] = b[i] + 2 * c[i];
            t = t + a[i];
        }
```

FIG. 4 shows an exemplary static profiling using the gimple static profiling. In profiling, a form of dynamic program analysis (as opposed to static code analysis), investigates a program's behavior using information gathered as the program executes. The usual purpose of this analysis is to determine which sections of a program to optimize—to increase its overall speed, decrease its memory requirement or sometimes both. A (code) profiler is a performance analysis tool that, most commonly, measures only the frequency and duration of function calls, but there are other specific types of profilers (e.g. memory profilers) in addition to more comprehensive profilers, capable of gathering extensive performance data.

In the example of FIG. 4, the C code is reduced to a series of two operand operations. Thus, the first four operations perform a[i]=b[i]+2*c[i]+t, and in parallel the last four operations perform a[i]=b[i]+2*c[i]+t for the next value of i and the result of both groups are summed in the last operation.

FIG. 5 shows a simple base level chip specification to implement the above application. Each variable i, a[i], b[i], c[i], t, and tmp are characterized as being read or written. Thus, at time 502, i is read and checked against a predetermined limit. In 504, I in incremented and written, while c[i] is fetched. In 506, b[i] is read while a tmp variable is written to store the result of 2*c[i] and read from to prepare for next operation. In 508, a[i] is written to store the result of tmp added to b[i], and t is retrieved. In 510, t is written to store the result of the addition in 508, and i is read. From 512-520, the sequence in 502-510 is repeated for the next i.

FIG. 6 shows a first architecture from the base line architecture of FIG. 5. In 604, variables I and c[i] are read. In 606, i is incremented and the new value is stored. B[i] is read, while tmp stores the result of 2*c[i] and then read for next operation. In 608, b[i] is added to tmp and stored in a[i], and the new a[i] and t are read for next operation. In 610, t is added to a[i], and the result is stored in t. In 612-618, a similar sequence is repeated for the next value of i.

Figure 7:
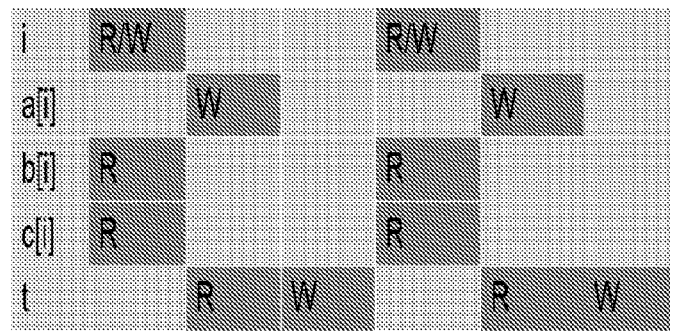
FIG. 7 shows a second architecture from chip specification of FIG. 5.
Figure 7:
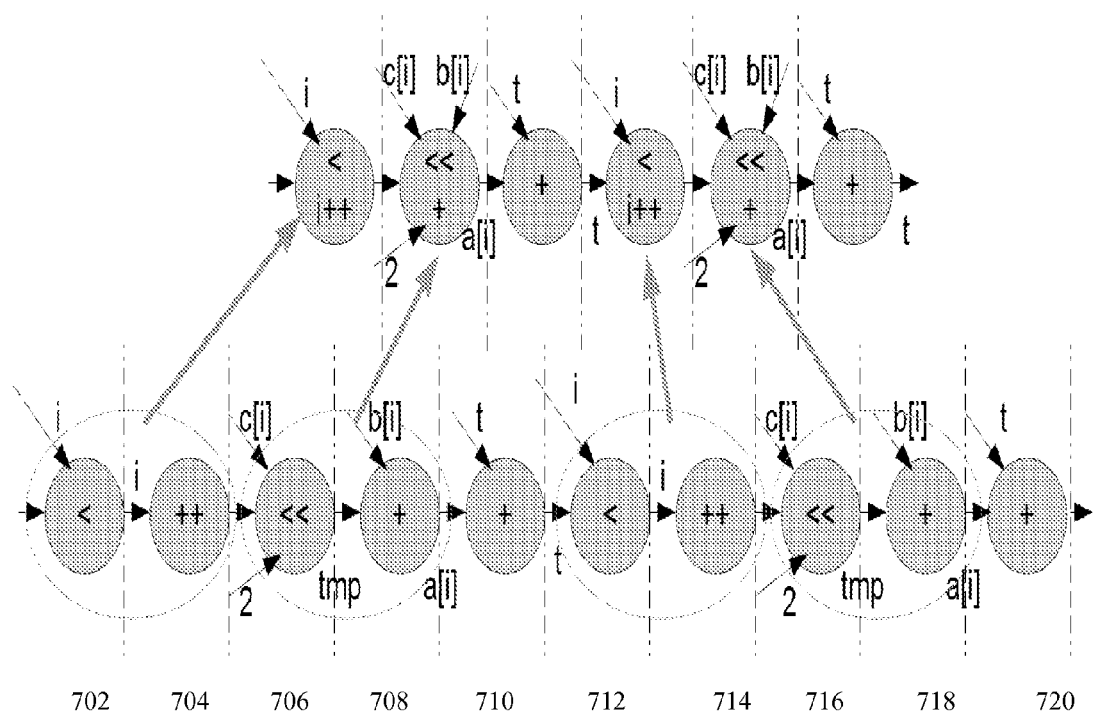

FIG. 7 shows a second architecture from the base line architecture of FIG. 5. In this architecture, the architecture optimizer detects that operations 702 and 704 can be combined into one operation with a suitable hardware. This hardware can also handle operations 706-708 in one operation. As a result, using the second architecture, i is checked to see if it exceeds a limit, and auto-incremented in one operation. Next, operations 706-708 are combined into one operation to do 2*c[i]+b[i] and storing the result as a[i]. In the third operation, t is added to a[i]. A similar 3 operation is performed for the next value of i.

The second architecture leverages knowledge of the hardware with auto-increment operation and multiply-accumulate operation to do several transactions in one step. Thus, the system can optimize for performance to the architecture.

Since program pieces and the multiple processing units come in a range of sizes, a fair number of combinations are possible, requiring different optimizing approaches. The architecture optimizer first identifies potential parallel units in the program then performs dependency analysis on them to find those segments which are independent of each other and can be executed concurrently.

Another embodiment of the concurrent optimization allowed in such system is the mitigation of Voltage Drop/IR Hot Spots. The process associates every machine instruction with an associated hardware execution path, which is a collection of on-chip logic and interconnect structures. The execution path can be thought of as the hardware "foot-print" of the instruction. The data model maintains a record of all possible execution paths and their associated instructions. The data model receives a statistical profile of the various machine instructions and extracts from this a steady state probability that an instruction is executed in any given cycle. The data model can create an estimated topological layout for each instruction execution path. Layout estimation is performed using a variety of physical design models based on a pre-determined protocol to select the appropriate level of abstraction needed for the physical design modeling. The data model associates instructions' steady state probability of execution to the topology of its execution path. The data model creates sub-regions of the layout and for each sub-region there is a collection of intersecting execution paths which yields a collection of execution path probabilities which is used to compute a sub-region weight. The sub-region weight distribution (over the entire region) is used to estimate power hot-spot locations. The data model identifies impacted instructions whose execution paths intersect power hot-spots. Power hot-spot regions are then modeled as virtual restricted capacity resources. The data model arranges for scheduler to see the impacted instructions as dependent on the restricted capacity resources. Restricted capacity translates to limiting the number of execution paths in a sub-region that should be allowed to activate in close succession. Such a resource dependency can be readily added to resource allocation tables of a scheduler. The scheduler optimization will then consider the virtual resources created above in conjunction with other performance cost functions. Thus power and performance are simultaneously optimized. The system can generate functional block usage statistics from the profile. The system can track usage of different processing blocks as a function of time. The system can speculatively shut down power for one or more processing blocks and automatically switch power on for turned off processing blocks when needed. An instruction decoder can determine when power is to be applied to each power domain. Software tools for the custom IC to run the application code can be automatically generated. The tools include one or more of: Compiler, Assembler, Linker, Cycle-Based Simulator. The tool automatically generates firmware. The tools can profile the firmware and providing the firmware profile as feedback to optimizing the architecture. The instruction scheduler of the compiler can arrange the order of instructions, armed with this power optimization scheme, to maximize the benefit.

The key idea is to anticipate the physical constraints and effects by estimation and virtually constructing the physical design with only architectural abstract blocks. In one example, it is possible to construct a floorplan based on a set of black boxes of estimated area. Having such construction at architecture level allows the system to consider any congestion, timing, area, etc. before the realization of RTL. In another example, certain shape or arrangement of black boxes may yield better floorplan and therefore, better timing, congestion, etc. Thus, it provides the opportunities to mitigate these issues at architecture level itself. Analogy to the physical world, an architect may consider how a house functions by considering the arrangement of different rooms without knowing the exact dimensions of aspect ratio, nor the content of the rooms.

The system alleviates the problems of chip design and makes it a simple process. The embodiments shift the focus of product development process back from the hardware implementation process back to product specification and computer readable code or algorithm design. Instead of being tied down to specific hardware choices, the computer readable code or algorithm can always be implemented on a processor that is optimized specifically for that application. The preferred embodiment generates an optimized processor automatically along with all the associated software tools and firmware applications. This process can be done in a matter of days instead of years as is conventional. The system is a complete shift in paradigm in the way hardware chip solutions are designed. Of the many benefits, the three benefits of using the preferred embodiment of the system include 1) Schedule: If chip design cycles become measured in weeks instead of years, the user can penetrate rapidly changing markets by bringing products quickly to the market; and
2) Cost: The numerous engineers that are usually needed to be employed to implement chips are made redundant. This brings about tremendous cost savings to the companies using system.
3) Optimality : The chips designed using The instant system product have superior performance, Area and Power consumption.

By way of example, a computer to support the automated chip design system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method to automatically design a custom integrated circuit, comprising:
    receiving a specification of the custom integrated circuit including computer readable code and one or more constraints on the custom integrated circuit;
    automatically generating a customized architecture for the computer readable code meeting constraint(s)using an Automatic Optimal Instruction Set Architecture Generator (AOISAG) working with data from both feedforward and feedback data to the AOISAG and generating custom instructions for the customized architecture,
    wherein the generating comprise:
    automatically determining an instruction execution sequence based on code profile and reassigning or delaying the instruction sequence to spread operation over one or more processing blocks to reduce hot spots
    automatically identifying potential parallel units in the computer readable code that can be executed concurrently by:
    from machine instructions level of the computer readable code, determining sequential statements in the computer readable code that is parallelizable,
    performing translation of the sequential code to machine instructions for parallel execution on different processors when the sequential code is independent of each other; and
    continuously evaluating and optimizing one or more factors including physical implementation, and local and global area, timing, or power at an architecture level above RTL or gate-level synthesis until the constraints are met;
    automatically generating a software development kit (SDK) and the associated firmware automatically to execute the computer readable code on the custom integrated circuit with the customized architecture;
    automatically generating associated test suites and vectors for the computer readable code on the custom integrated circuit with the customized architecture; and
    automatically synthesizing the customized architecture and generating a computer readable description of the custom integrated circuit for semiconductor fabrication.

2. The method of claim 1, further comprising performing static profiling of the computer readable code.

3. The method of claim 1, further comprising performing dynamic profiling of the computer readable code.

4. The method of claim 1, further comprising selecting an architecture based on the computer readable code.

5. The method of claim 1, further comprising optimizing the architecture based on static and dynamic profiling of the computer readable code.

6. The method of claim 1, further comprising compiling the computer readable code into assembly code.

7. The method of claim 6, further comprising linking the assembly code to generate firmware for the selected architecture.

8. The method of claim 7, further comprising performing cycle accurate simulation of the firmware.

9. The method of claim 7, further comprising performing dynamic profiling of the firmware.

10. The method of claim 9, further comprising optimizing the architecture based on profiled firmware.

11. The method of claim 7, further comprising optimizing the architecture based on the assembly code.

12. The method of claim 1, further comprising generating register transfer level code for the selected architecture.

13. The method of claim 12, further comprising performing synthesis of the RTL code.

14. The method of claim 1, further comprising an Automatic Optimal Instruction Set Architecture Generator (AOISAG) controlling an Automatic Optimal RTL Generator (AORTLG) coupled to an Automatic Optimal Chip Generator (AOCHIPG), wherein the AOCHIPG and AORTLG is in a feedback loop to the AOISAG, wherein the AOISAG controls an Automatic Optimal Firmware Tools Generator (AOFTG) coupled to an Automatic Optimal Firmware Generator (AOFG) in a feedback loop to the AOISAG.

15. The method of claim 1, wherein the customized architecture comprises specialized accelerator modules.

16. A system to automatically design a custom integrated circuit, comprising:
a processor for receiving a specification of the custom integrated circuit including computer readable code and one or more constraints on the custom integrated circuit;
code, which when execute by the processor, automatically generating a computer architecture for the computer readable code meeting the constraints with an Automatic Optimal Instruction Set Architecture Generator (AOISAG) controlling an Automatic Optimal RTL Generator (AORTLG) coupled to an Automatic Optimal Chip Generator (AOCHIPG), wherein the AOCHIPG and AORTLG is in a feedback loop to the AOISAG, wherein the AOISAG controls an Automatic Optimal Firmware Tools Generator (AOFTG) coupled to an Automatic Optimal Firmware Generator (AOFG) in a feedback loop to the AOISAG,
wherein the generating further comprises:
automatically determining an instruction execution sequence based on code profile and reassigning or delaying the instruction sequence to spread operation over one or more processing blocks to reduce hot spots,
automatically identifying potential parallel units in the computer readable code that can be executed concurrently by:
from machine instructions level of the computer readable code, determining sequential statements in the computer readable code that is parallelizable,
performing translation of the sequential code to machine instructions for parallel execution on different processors when the sequential code is independent of each other; and
continuously evaluating and optimizing one or more factors including physical implementation, and local and global area, timing, or power at an architecture level above RTL or gate-level synthesis until the constraint is met;
automatically generating a software development kit (SDK) and the associated firmware automatically to execute the computer readable code on the custom integrated circuit with the customized architecture;
automatically generating associated test suites and vectors for the computer readable code on the custom integrated circuit with the customized architecture; and
automatically synthesizing the customized architecture and generating a computer readable description of the custom integrated circuit for semiconductor fabrication.

17. The system of claim 16, further comprising performing static and dynamic profiling of the computer readable code.

18. The system of claim 16, further comprising selecting an architecture based on the computer readable code.

19. The system of claim 16, further comprising optimizing the architecture based on profiles of the computer readable code.

20. The system of claim 16, further comprising a compiler to convert the computer readable code into assembly code.

21. The system of claim 16, further comprising a cycle accurate simulator to test the firmware.

22. The system of claim 16, further comprising register transfer level code generator for the selected architecture.

* * * * *